(12) United States Patent
Zhang et al.

(10) Patent No.: US 6,169,399 B1
(45) Date of Patent: Jan. 2, 2001

(54) MULTIPLE RESONANCE SUPERCONDUCTING PROBE

(75) Inventors: Kuan Zhang, Arlington Heights, IL (US); Jason R. Miller; Ki Mun, both of New York, NY (US); Qiyuan Ma, Nanuet, NY (US)

(73) Assignee: The Trustees of Columbia University in the City of New York, New York, NY (US)

( * ) Notice: Under 35 U.S.C. 154(b), the term of this patent shall be extended for 0 days.

(21) Appl. No.: 08/982,164

(22) Filed: Dec. 1, 1997

Related U.S. Application Data

(60) Provisional application No. 60/031,533, filed on Dec. 2, 1996.

(51) Int. Cl.[7] .................................................. G01V 3/00
(52) U.S. Cl. .............................................. 324/318; 324/309
(58) Field of Search .................................. 324/318, 322, 324/300, 309; 333/395

(56) References Cited

U.S. PATENT DOCUMENTS

| | | | |
|---|---|---|---|
| 4,446,431 | 5/1984 | McKay | 324/318 |
| 4,926,289 | 5/1990 | Reichert | 324/318 |
| 5,189,386 | 2/1993 | Tada et al. | 324/309 |
| 5,276,398 | 1/1994 | Withers et al. | 324/318 |
| 5,280,248 | 1/1994 | Zou et al. | 324/309 |
| 5,351,007 | 9/1994 | Withers et al. | 324/318 |

OTHER PUBLICATIONS

Withers et al., "Thin–Film HTS Probe Coils for Magnetic–Resonance Imaging," *IEEE Transactions on Applied Superconductivity*, vol. 3, No. 1, p. 2450–2453, Mar. 1993.
Penn et al., "Design of RF Receiver Coils Fabricated from High Temperature Superconductor for Use in Whole Body Imaging Equipment," *World Congress of Superconductivity*, vol. 1, Nos. 10–12, pp. 1855–1861, 1993.
Hill, "A High–Sensivity NMR Spectroscope Probe Using Superconductive Coils," *Magnetic Moments*, vol. 8, No. 1, p. 1, 4–6, 1996.

*Primary Examiner*—Christine K. Oda
*Assistant Examiner*—Brij B. Shrivastav
(74) *Attorney, Agent, or Firm*—Baker Botts LLP

(57) ABSTRACT

A superconducting multiple resonance probe for detecting multiple nuclei resonating at different frequencies for use in magnetic resonance imaging, microscopy and spectroscopy. The probe is configured as having two or more superconducting coils in close proximity, each coil tuned to a different frequency, where an adjustment is made for a frequency shift caused by the mutual inductance between the coils. The coils can be placed in concentrically in a plane or can be vertically layered.

17 Claims, 7 Drawing Sheets

MULTIPLE RESONANCE SUPERCONDUCTING PROBE

This application claims priority to the provisional application Ser. No. 60/031,533 filed Dec. 2, 1996 by Zhang, Miller, Mun and Ma and entitled "Multiple Resonance Superconducting Probe."

TECHNICAL FIELD

The present invention relates to a multiple resonance superconducting probe for detecting multiple nuclei. The probe can be used, for example, to produce high quality magnetic resonance images.

BACKGROUND OF THE INVENTION

Magnetic loop probes have previously been used to detect signals within a single selected frequency range in a number of applications such as magnetic resonance imaging. Conventional receiving loops typically used today are made from copper wire.

Magnetic resonance imaging ("MRI") is used in the medical field to produce images of various parts of the body for examination and diagnosis by measuring the response of selected nuclei in the body when subjected to a magnetic field. The MRI probe is configured to have a resonance frequency equal to the resonance frequency of the selected nuclei. An example of a MRI performed is a mammography, which detects lumps in a woman's breast. A probe in the form of a coil is placed around the breast being examined and a MRI "picture" is taken. The MRI picture is based on the detection of a particular nuclei in the tissue by a coil with the same resonance frequency as the particular nuclei being imaged. Another example of an MRI application is of a human head for the detection of a tumor or cancer. There are two commonly used MRI probes: a body coil and a surface coil. The body coil is large enough to enclose a part of a human or animal body such as a head coil. The surface coil is in a shape of a plane or of a local surface of a body organ. The surface coil is placed in close proximity to the imaging area, thus has a small field of view ("FOV") which gives a high resolution image of a local region of interest. Conventionally, the wire coils used for an MRI are not made from superconducting materials.

Recently, superconducting probes have been used in MRI, microscopy (MRM), and spectroscopy (MRS) to improve the signal-to-noise ratio (SNR) of the probe over the conventional copper wire probes. These superconducting probes can provide substantial SNR gains by lowering the noise contribution of the receiving coil. This is due to the fact that the resistance of a superconductor at RF frequency (1–500 MHz) and cryogenic temperature is about three orders of magnitude lower than that of metal. Lower resistance of a superconductor leads to a higher quality factor (Q) of a coil made from a superconductor, which in turn, increases the SNR of the probe since the SNR is proportional to the square root of Q. As a comparison, a thin film coil made of high temperature superconductor ("HTS") material has a Q of over 10,000 at 33.7 MHz and 77 K, while a similar thin film coil image using the metal Ag has a Q of 10 at the same frequency and temperature.

Because the Q value of a thin metal film coil is so low in practice, metal wires (mainly Cu) are used to make both conventional body coils and surface coils. In general, the coils made of Cu wires have Q values of 100–500. The low resistance nature of the superconductor allows the realization of a thin film coil to a have a Q value even higher than the wire coil.

Magnetic loop probes have been developed to produce an MRI picture based on the presence of sodium 23 ($^{23}$Na), a nuclei that is very useful for medical imaging. A probe made with superconducting materials can achieve a signal-to-noise ratio ("SNR") at least a factor of 10 higher than that of a copper coil that creates a large amplitude of noise due to its high internal resistance. Such SNR gains are of critical importance to in vivo $^{23}$Na MRI which generally suffers from a poor SNR as a result of the low overall sensitivity of $^{23}$Na. Another major practical difficulty associated with a $^{23}$Na MRI is to correctly localize the probe with respect to the area of interest to be imaged.

It would therefore be beneficial to detect two or more resonating nuclei at the same time which have different resonance frequencies. It would be desirable to detect the multiple resonances with a single probe in order to properly localize and focus on the desired area to be scanned. However, if multiple receiver coils are located in close proximity, the mutual inductance created between the two coils must be taken into account in order for the probe to be properly tuned.

SUMMARY OF THE INVENTION

The present invention is a multiple resonance superconductor probe which can be used in MRI, MRM and MRS applications, among others. The multiple resonance probe has a plurality of coils created from superconducting thin film disposed on a substrate. Each coil preferably consists of a spiral inductor with interdigited fingers between the inner and outer loops. The coils in the preferred embodiment are concentric around a common point to increase the overall field of view of the probe for the plurality of receiving coils. The probe is constructed to take into account the effect of the mutual inductance between the individual receiving coils on the substrate and can be further finely tuned for each coil configuration by changing the number of fingers attached to a particular coil. The multiple resonance probe allows for improved imaging of a desired subject from the additional data obtained from the added resonance frequencies. The multiple resonance probe can be made by depositing a superconducting film on a substrate, creating the proper coil configuration to account for mutual inductance and finely tuning the individual coils.

The multiple resonance probe can also be constructed using separate layers for each receiving coil, where a buffer layer is placed in between any two adjacent coil layers. The multi-layered configuration allows for using coils with an equal diameter to increase the mutual field of view for all the receiving coils.

BRIEF DESCRIPTION OF THE DRAWINGS

Further objects, features and advantages of the invention will become apparent from the following detailed description taken in conjunction with the accompanying drawings showing the preferred embodiments of the invention, in which.

DESCRIPTION OF A PREFERRED EMBODIMENT

A multiple resonance ("multi-resonance") superconducting probe will increase the quality of magnetic resonance images or enhance other applications which can utilize data from reading multiple resonance frequencies. The multiple resonance coils are placed in a single probe so that the same region can be examined using two or more different nuclei simultaneously. Information from one of the nuclei can be used to determine the exact location of the probe so that lower resolution information from the other nuclei, which may not be able to locate the probe by itself, can be used for analysis.

The preferred embodiment described herein is for a double resonance probe in a MRI application. However, the invention is not limited to only two receiving coils but could also contain three or more receiving coils which are configured using the same principles and techniques described below. Moreover, the multi-resonance probe is not limited to only MRI applications as described herein, but can be used for detecting multiple frequencies in a frequency spectrum for any purpose.

The use of a multiple resonant superconducting probe for ($^1$H) and $^{23}$Na to produce a MRI allows for correlation between the high resolution anatomic presentation of $^1$H and the $^{23}$Na distribution. Moreover, combined $^1$H and $^{23}$Na MRI provides complementary information which will result in better characterization of the tissue being imaged.

The probe design herein described as the first preferred embodiment consists of two separate coaxial coils located on the same substrate, each tuned to the resonant frequency of $^{23}$Na or $^1$H. A challenge associated with the design of this superconducting double resonant probe is calculating the coupling between the coils in order to account for the mutual inductance. The mutual inductance effectively couples impedance in the resonant circuits, shifting the resonance frequencies. By determining the coefficient of coupling, the shifted resonance frequencies of the coils can be found. Correspondingly, knowing the coefficient of coupling, the proper resonance frequencies of the probes may be calculated in order to design a correctly tuned probe. Failing to account for the coupled impedance in the design of the coils results in the probe being off-resonance.

Figure 1:
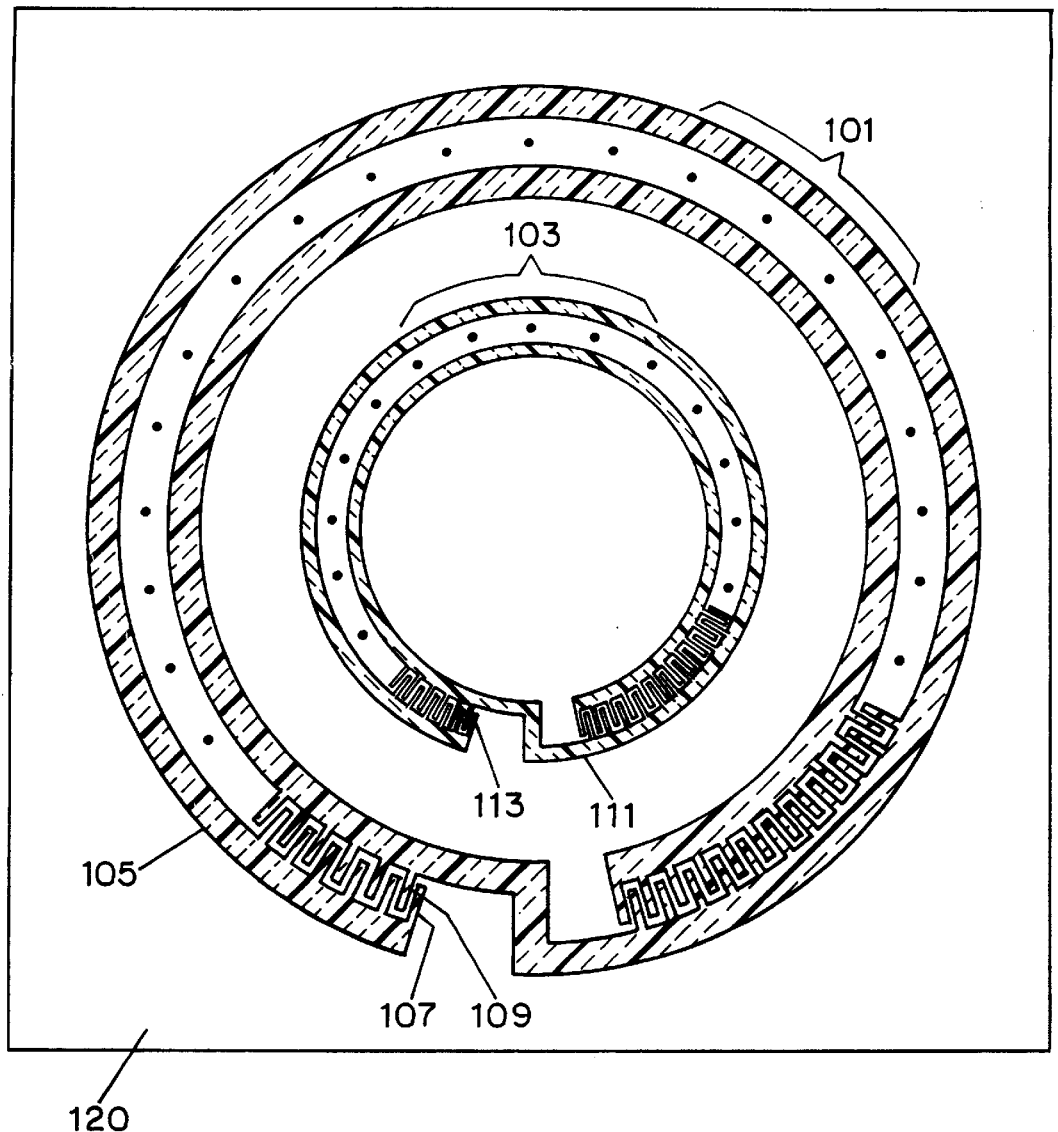
FIG. 1 is a layout of a multiple resonance superconducting probe constructed in accordance with the invention.

FIG. 1 shows the layout of a multiple resonance superconducting probe constructed in accordance with the invention. While this example shows only two separate receiving coils, additional coils for receiving additional resonance frequencies can be placed concentrically around or within the shown coils. Superconducting probe 100 is shown with two coils, outer receiving coil 101 and inner receiving coil 103 both located on a substrate 120. Each coil is made from a superconducting material such as $Y_1Ba_2Cu_3O_{7-x}$. Outer coil 101 has a spiral coil 105 and "fingers" which are elongated portions of the superconducting material. An example of the fingers in the figure are finger 107 and finger 109. The spiral coil portion provides the inductance to the receiving coil and the interwoven fingers (also called digits) provide the necessary capacitance for a receiving coil to tune its resonance frequency. The resonance frequency of the coil is directly related to the inductance and capacitance of the configuration. The capacitance of coil 101 is directly related to the number of fingers present in the coil. The inner coil 103 also has a spiral coil 111 and a number of finger attached to spiral coil 111, such as finger 113 for example. The substrate 120 may be planar or may be flexible such that it can be bent or wrapped around a subject to be imaged.

Each receiving coil detects a different frequency produced from the magnetized nuclei when performing magnetic resonance imaging. The probe of FIG. 1 is configured to detect $^1$H for the inner receiving coil and $^{23}$Na for the outer receiving coil. The concentric placement of the coils on a substrate allows for a increased mutual field of view for both receiving coils while reducing the mutual inductance between the coils.

The receiving coils in FIG. 1 can be made from $Y_1Ba_2Cu_3O_{7-x}$ (YBCO) superconducting thin film on a single crystal $LaAlO_3$ substrate and can be patterned using either reactive ion implantation or dry or wet etching. The probe consists of two separate, coaxial coils on the same substrate tuned to the Larmor frequency of $^{23}$Na and $^1$H in a 3 T magnetic field, corresponding to 33.77 MHz and 127.71 MHz, respectively. As stated above, each receiving coil design consists of a single loop inductor with interdigital capacitors between the turns of the inductor. For the outer coil in this example, the inductor line widths are 275 $\mu$m and the interdigital fingers are 33 $\mu$m wide and spaced 22 $\mu$m apart. For the inner coil in this example, the inductor line widths are 139 $\mu$m and the interdigital fingers are 90 $\mu$m wide and spaced 60 $\mu$m apart. The high frequency resonance coil (outer coil) has on the order of 100–200 pairs of fingers and the low frequency resonance coil (inner coil) has on the order of 500–600 pairs of fingers. The invention is not limited to the specific dimensions described but the dimensions will be changed depending upon the desired FOV, anticipated mutual inductance and the resonance frequency which is to be detected.

The size of the coils are chosen to balance the following objectives: a significant SNR gain factor, a sufficiently large field of view, and weak coupling between the resonators. The outer and inner coil diameters are 2.44 cm and 1.39 cm, respectively, for this example. The two coils have a mutual inductance which causes the resonance frequency of each coil to change. In order to detect the selected frequency of a particular nuclei, the coil design must take into account the mutual inductance.

Figure 2A:
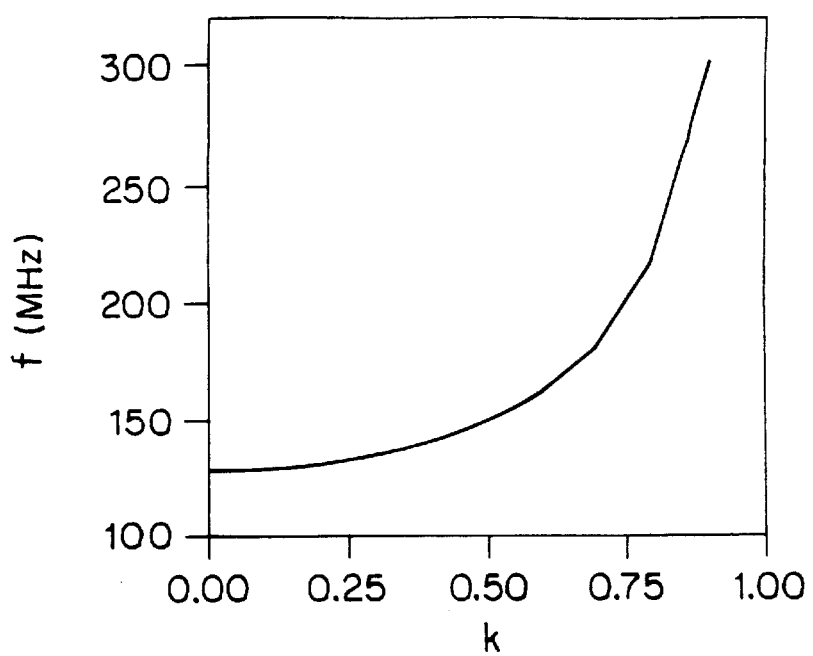
FIG. 2A is a graph of the resonance frequency of a high frequency receiving coil verses the coefficient of coupling between two coils.
Figure 2B:
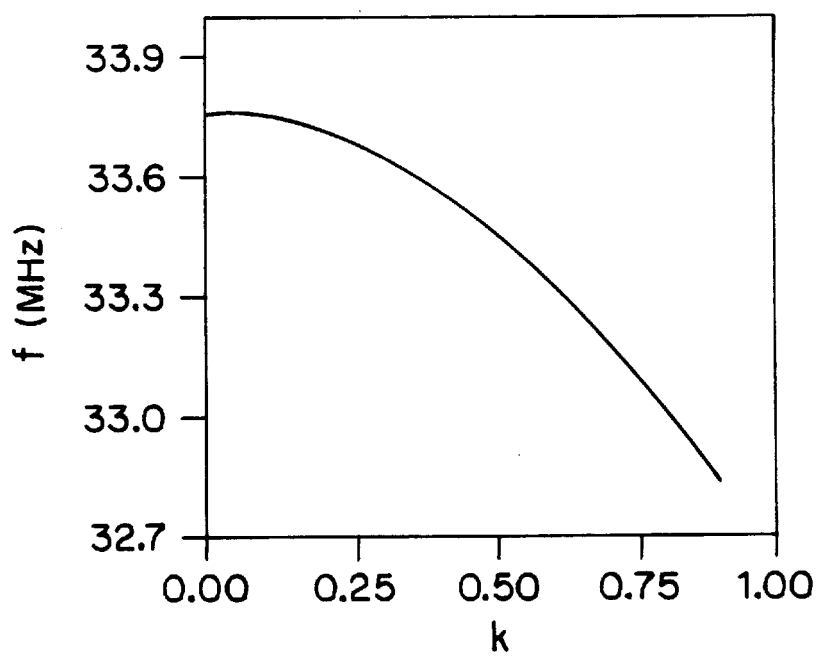
FIG. 2B is a graph of the resonance frequency of a low frequency receiving coil verses the coefficient of coupling between two coils.

FIGS. 2A and 2B show the plots of the resonance frequency of the multi-resonance superconducting coil described in FIG. 1 as a function of the coefficient of coupling between the two receiving coils. The coefficient of coupling increases to 1 as the coils get closer together. FIG. 2A shows the resonance frequency of the outside coil 101 increases dramatically as the coils get closer together. FIG. 2B shows the resonance frequency of the inner coil 103 decreases as the coils get closer together. This resonance shifting effect must be accounted for in the final design of each coil which is part of the probe.

Figure 3:
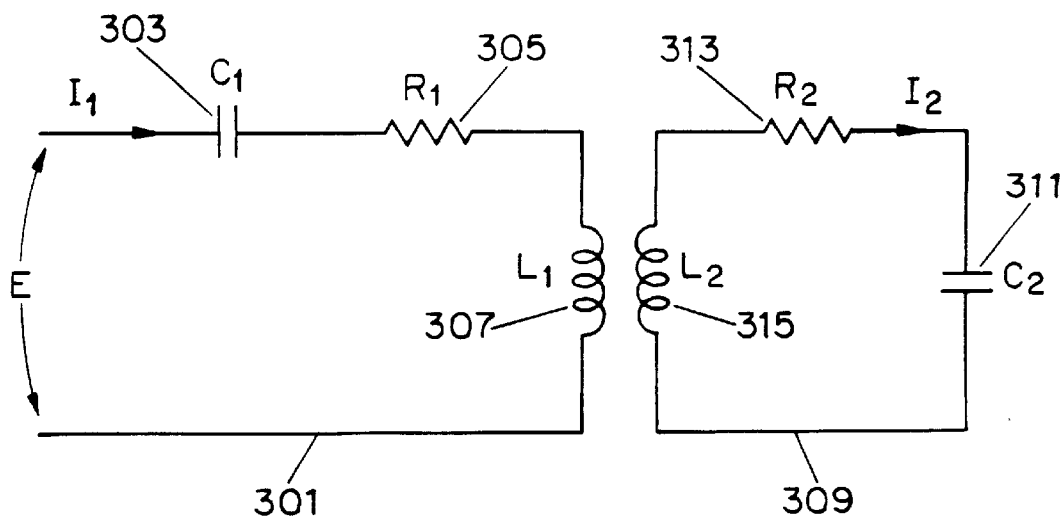
FIG. 3 is a circuit diagram modeling two adjacent coils in a multi-resonance probe.

The effect and solution of adjusting for the mutual inductance of two receiving coils will now be described. The following analysis can also be extended to three or more receiving coils all within the same probe. Two resonators in close proximity will couple their respective magnetic fields. This magnetic field coupling between the resonators is described by the mutual inductance (M) which is given by $$M = k\sqrt{L_{11}L_{22}} \tag{1}$$

where k is the coefficient of coupling, $L_{11}$ is the primary self inductance of the first receiving coil and $L_{22}$ is the secondary self inductance of the second receiving coil. The coupled resonator coils can be modeled by two simple circuits as shown in FIG. 3. Each circuit in FIG. 3 contains a capacitor, a resistor and an inductor in series, where the inductors of each circuit are coupled.

FIG. 3 shows a first circuit 301 which contains a capacitor C1 303 connected in series to a resistor R1 305 connected in series to an inductor L1 307. Second circuit 309 which is located in proximity to the first circuit 301 contains a capacitor 311 connected in series to a resistor 313 connected in series to an inductor 315, and the inductor is connected to capacitor 311 to form a complete circuit. It can be shown that the presence of the coupled secondary circuit 309 adds an equivalent impedance $(\omega M)^2/Z_S$ to the primary circuit 301 which shifts the resonant frequency depending on the mutual inductance. The resonance frequency of the second circuit 309 is likewise effected by the first circuit 301. When the coefficient of coupling is negligible, the coupled impedance is correspondingly small and the primary circuit is nearly the same as though the secondary circuit was not present. The frequency spectrum will contain two peaks at the intended center frequencies. As the coefficient of coupling increases, the lower frequency resonator will be shifted downward and the higher frequency resonator will be shifted upward. In order to design the double resonant probe so that it resonates at the correct frequencies, the mutual inductance between the coils must be taken into account. This requires two steps: a determination of the coefficient of coupling and a derivation of an expression for the resonant frequencies of the probe as a function of the coupling.

The coefficient of coupling is determined by the size and geometry of the coils, and their relative position. To calculate the coupling, the coils are modeled as two loops of wire whose radii are a and b with parallel axes a distance c apart and planes a distance d apart. The general form for the mutual inductance between two such loops is given by $$M = \mu \pi a b \int_0^\infty J_1(Ka) J_1(Kb) J_0(Kc) e^{-Kd} dK \tag{2}$$

where $\mu$ is the permeability, J1(Ka), J1(Kb), J0(Kc) are Bessel functions of the first and second order, and K is given by $$K = \sqrt{\frac{4ab}{(a+b)^2 + c^2}} \tag{3}$$

For the case considered here, that of the configuration of FIG. 1, c=0 and d=0 because the loops are coaxial and coplanar. The self inductances, $L_{11}$ and $L_{22}$, of the loops may be calculated from $$L_{11} = \mu a \left( \ln \frac{8a}{r} - 1.75 \right) \tag{4}$$

$$L_{22} = \mu b \left( \ln \frac{8b}{r} - 1.75 \right)$$

where r is the radius of the wire. After substitution of equations (2) and (4) into equation (1) the coefficient of coupling may be obtained. The coupling between the loops increases as the ratio b/a approaches unity. Therefore, the coupling increases as the two coils move closer together. To minimize the coupling, the b/a ratio should be made as small as possible and thus the coils placed as far apart as possible. However, the ratio can only be reduced to a point after which the usefulness of the probe diminishes as the field-of-view (FOV) becomes impracticably small.

The impedance in the primary circuit 301 and secondary circuit 309 of FIG. 3 is composed of both resistive and reactive elements which can be written as $$Z_p = R_1 + j\left(\omega L_1 - \frac{1}{\omega C_1}\right) \equiv R_1 + jX_1 \tag{5}$$

$$Z_s = R_2 + j\left(\omega L_2 - \frac{1}{\omega C_2}\right) \equiv R_2 + jX_2$$

where $R_1$ 305 and $R_2$ 313 are the resistances, $L_1$ 307 and $L_2$ 315 are the inductances, $C_1$ 303 and $C_2$ 311 are the capacitances, and $X_1$ and $X_2$ are defined as the total reactance for each circuit. By applying Kirchoff's laws to the circuit the current in the secondary circuit, $I_2$, is obtained. The expression for the absolute magnitude of the secondary current is given by $$|I_2| = \frac{E\omega M}{\sqrt{(R_1 R_2 - X_1 X_2 + \omega^2 M^2)^2 + (X_1 R_2 + X_2 R_1)^2}} \tag{6}$$

The secondary current will be maximum when the denominator is minimum. Upon differentiating the denominator with respect to $X_2$, $I_2$ will be maximum when $$X_2 = X_1 \omega^2 \frac{M^2}{R_1^2 + X_1^2} \tag{7}$$

A similar expression can be found for the primary current. Defining the following relations:

$$\omega_1^2 = \frac{1}{L_1 C_1}, \omega_2^2 = \frac{1}{L_2 C_2}, Q_1 = \frac{\omega L_1}{R_1}, Q_2 = \frac{\omega L_2}{R_2} \tag{8}$$

and substituting the values of $X_1$ and $X_2$ in equation (7), gives $$f^4(1-k^2) - f^2(f_1^2 + f_2^2) + f_1^2 f_2^2 = 0 \tag{9}$$

where the roots of f are the resonant frequencies of the probe which account for the mutual inductance and $f_1$ and $f_2$ are the resonant frequencies of the coils when the coupling is zero. The one assumption made in obtaining equation (9) is that the quality factor of the primary resonator is high such that $1/Q_1^2$ is negligible, which is not unreasonable for a superconducting resonator. The roots of f are of the form $\pm f_1'$ and $\pm f_2'$ and are given by $$f_1' = \frac{\sqrt{\frac{1}{2}(f_1^2 + f_2^2) - \frac{1}{2}\sqrt{(f_1^2 - f_2^2)^2 + 4k^2 f_1^2 f_2^2}}}{\sqrt{1-k^2}} \quad (10)$$

$$f_2' = \frac{\sqrt{\frac{1}{2}(f_1^2 + f_2^2) + \frac{1}{2}\sqrt{(f_1^2 - f_2^2)^2 + 4k^2 f_1^2 f_2^2}}}{\sqrt{1-k^2}}$$

Equation (10) permits calculation of the shifted resonant frequencies in terms of the coefficient of coupling and the values of $f_1$ and $f_2$. If the two coils have negligible coupling then equation (10) simplifies to $f_1'=f_1$ and $f_2'=f_2$. As to how small k must be in order to be negligible depends on the relative values of $f_1$ and $f_2$. FIGS. 2A and 2B are plots of $f_1'$ and $f_2'$ as a function of the coupling for $f_1$=33.77 MHz and $f_2$=127.71 MHz corresponding to the resonant frequency of $^{23}$Na and $^1$H, respectively. The plots show that the effect of coupling is to shift the lower frequency resonator downward and the higher frequency resonator upward. As a consequence of this, coils properly tuned at zero coupling will be off-resonance for k>0. It is useful to determine the proper values of $f_1$ and $f_2$ for a particular coefficient of coupling which will result in the probe being correctly tuned. Solving equation (9) for $f_1$ and $f_2$ gives $$f_1 = f_1' \sqrt{1 - \frac{f_1'^2 k^2}{f_1'^2 - f_2^2}} \quad (11)$$

$$f_2 = f_2' \sqrt{1 - \frac{f_2'^2 k^2}{f_2'^2 - f_1^2}}$$

By setting $f_1'$ and $f_2'$ equal to the proper resonant frequencies of the probe in equation (11), $f_1$ and $f_2$ can be determined.

For the probe with its dimensions described in FIG. 1, the corresponding b/a ratio for the two coils is 0.6 which means from equations (1) to (4) that the coefficient of coupling is about 0.15. Solving equation (11) for k=0.2 with $f_1'$=33.77 MHz and $f_2'$=127.71 MHz, the coils should be designed to resonate at $f_1$=33.82 MHz and $f_2$=129.93 MHz in order for the probe to be on-resonance. For the selected b/a ratio in this example, the frequency shift is only significant for the higher frequency resonator.

Figure 4:
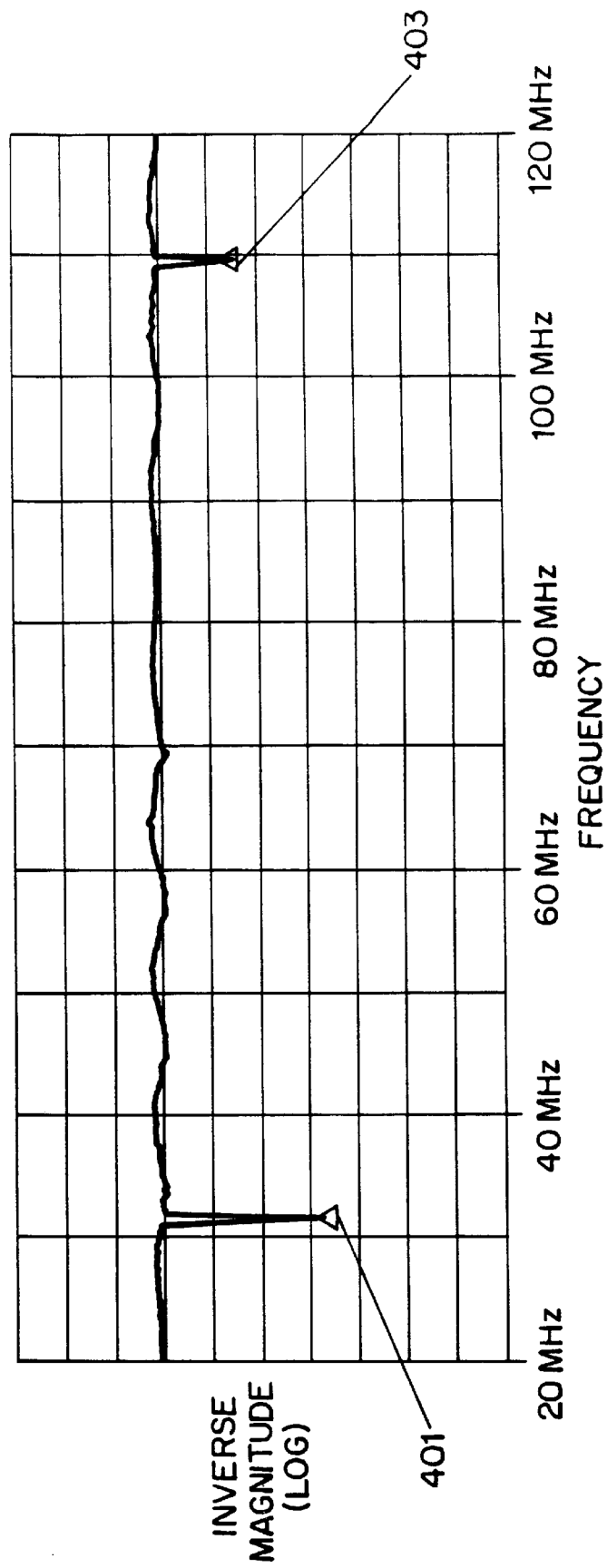
FIG. 4 is a graph of the response spectrum of the double resonant superconducting probe of FIG. 1.

FIG. 4 shows the response spectrum of a double resonant superconducting probe as described in FIG. 1. The frequency spectrum contains two peaks 401, 403 corresponding to the frequencies of $^{23}$Na and $^1$H, respectively. The peaks are within a few hundred kilohertz of their designed resonant frequency. The coefficient of coupling was found experimentally to be 0.2 which is in reasonable agreement with the calculated value of 0.15. The unloaded Q of the coils was measured to be $7.9\times10^3$ and $11.7\times10^3$ for $^{23}$Na and $^1$H, respectively.

Measurements of the multi-resonance superconducting probe were made with a Hewlett-Packard 8712B network analyzer. The probes were measured in a custom flow cryostat at a temperature of about 30K. The response and quality factor (Q) of the probes were determined by performing reflection measurements using an inductively coupled coaxial cable. Two dimensional (2-D) Fourier imaging experiments were run on phantoms and $^{23}$Na and $^1$H images were acquired.

The multiple resonance superconducting probe offers at least three significant advantages over conventional magnetic loop probes: a higher SNR, an efficient means of localizing the probe with respect to the area of interest, and the ability to acquire $^1$H and $^{23}$Na (or other nuclei) images of the same area of interest providing complimentary information which may lead to better tissue characterization. In addition, the probe design can be extended to other nuclei such as Potassium, Carbon, Nitrogen and Fluorine.

Figure 5:
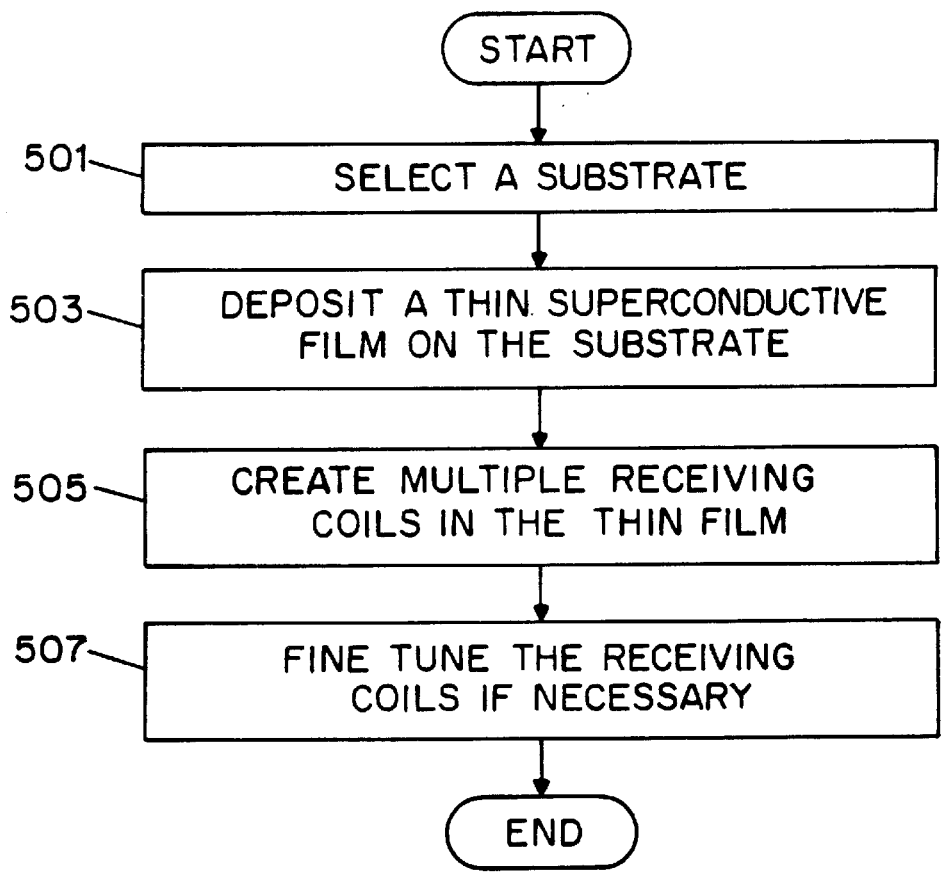
FIG. 5 is a flow chart of the steps for making the multi-resonant probe of FIG. 1.

FIG. 5 shows a flow chart of the steps to make a multiple resonance frequency superconducting probe as described in FIG. 1. The steps can be easily modified to make a superconducting probe for detecting three or more resonance frequencies.

Step 501 selects a substrate on which to deposit a thin film of superconducting material. The substrate should be chosen to be latticed matched or a crystal structure similar to a HTS material so that high quality HTS films can be grown on it. The substrate may by planar or may be flexible so that it can be bent or wrapped around a subject to be imaged. An example of a substrate that can be used is LaAlO$_3$. Step 503 deposits a thin film of superconducting material on the substrate. An example of the material which could be used is $Y_1Ba_2Cu_3O_{7-x}$ (YBCO).

Step 505 then creates the coil patterns in the superconducting thin film. The coil pattern is designed to adjust both the inductance (the length of the spiral inductor) and the capacitance (the number of fingers in the coil) to have a resonance frequency approximately equal to that which it is designed to detect. The design is based upon such considerations as a significant SNR gain factor (favoring a small coil), a large FOV (favoring a large coil) and weak coupling between the coils. The design takes into account any mutual inductance between the coils by using the above described model.

The coil manufacturing process can be accomplished by dry or wet etching or by ion implantation, for example. In a wet etching process, a mask is placed over the portion of superconducting film which is to be retained and the film is placed in a chemical bath which removes the superconducting material from the substrate where the mask is not present. In using a dry etching process (e.g., ion milling), again a mask is laid over the portions of the superconducting thin film which will constitute the receiving coils and ions are directed at the thin film removing a portion of the superconductive material and leaving only the superconducting film under the mask. In an ion implantation process, reactive ions (such as Si, B, Al, etc.) are implanted into a portion of the HTS material through a mask, where the mask covers the superconducting layer in the shape of the desired coil configuration. The ions are injected at an energy rate of 20–200 KeV and a dose of $10^{14}$–$10^{17}$/cm$^2$ to transfer the implanted portion into an insulator and leave the unimplanted portion superconducting. The results of these processes is a desired configuration of the superconducting thin film, such as the configuration in FIG. 1.

Step 507 then fine tunes the multiple receiving coils, if necessary, to the proper resonance frequency to account for any tolerances in the fabrication procedure or small inaccuracies in the design. The tuning process is accomplished by removing a number of fingers from each receiving coil to change the coils capacitance resulting in a change of resonance frequency. After the coils are finely tuned, they will each have the proper resonance frequency to detect the frequency of the resonating nuclei which they are directed to receiving.

Figure 6:
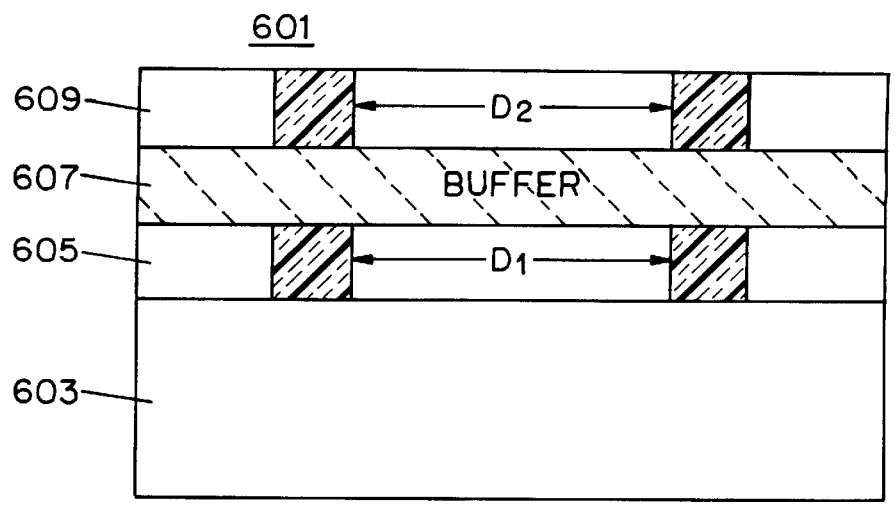
FIG. 6 shows a multi-layered configuration for the multiple resonance superconducting probe.

FIG. 6 shows a second preferred embodiment for the multiple resonance superconducting probe. In FIG. 6, the receiving coils are separately layered on a substrate using thin films. The layered configuration is in contrast to locating all the receiving coils concentrically on the same plane. FIG. 6 shows the multi-layered multi-resonance superconducting probe 601 with a substrate layer 603, a first coil layer 605, a buffer layer 607 and a second coil layer 609. While only two receiving coils are shown in this example, the invention includes using three or more receiving coils configured in accordance with the invention. This layered configuration allows the two coils to be physically the same, or similar, size while still detecting two different frequencies. FIG. 6 shows that the first receiver coil layer 605 has a diameter $D_1$ for its coil which is equal to the diameter $D_2$ of the second receiver coil. The resonance frequency of each coil layer can be adjusted after manufacture by removing a number of fingers with a laser beam or other method from the receiving coil to change the capacitance and thus change the resonance frequency. Two or more receiving coils with the same diameter which overlap in space will also have the same field of view which increases the area of detection on which the probe is used. Additionally, the configuration of overlapping layers separated by a buffer layer may actually cancel out the mutual inductance between the receiving coils.

Substrate 603 will typically be between 0.5 and 1 mm in width. A coil layer 605 is deposited on the substrate and has a typical width of between 0.1 and 0.5 $\mu$m. Next, a buffer layer 607 is deposited over the first coil layer so that the two adjacent coil layers will not come in contact and create a short-circuit. Additionally, the buffer layer reduces the effects of any mutual inductance. The buffer layer is typically 0.2 to 2 $\mu$m thick. Finally, a second coil layer 609 is deposited on top of the buffer layer and is aligned with the first coil layer 605. The second coil layer is typically 0.1 to 0.5 $\mu$m thick. Other thicknesses may also be used in accordance with the invention.

Additional coil layers can be easily added to the multi-layer configuration by placing an additional buffer layer on the top coil layer and placing the additional coil layer on top of the additional buffer layer. Each coil layer will detect a different resonance frequency to increase the quality of the imaging.

Figure 7:
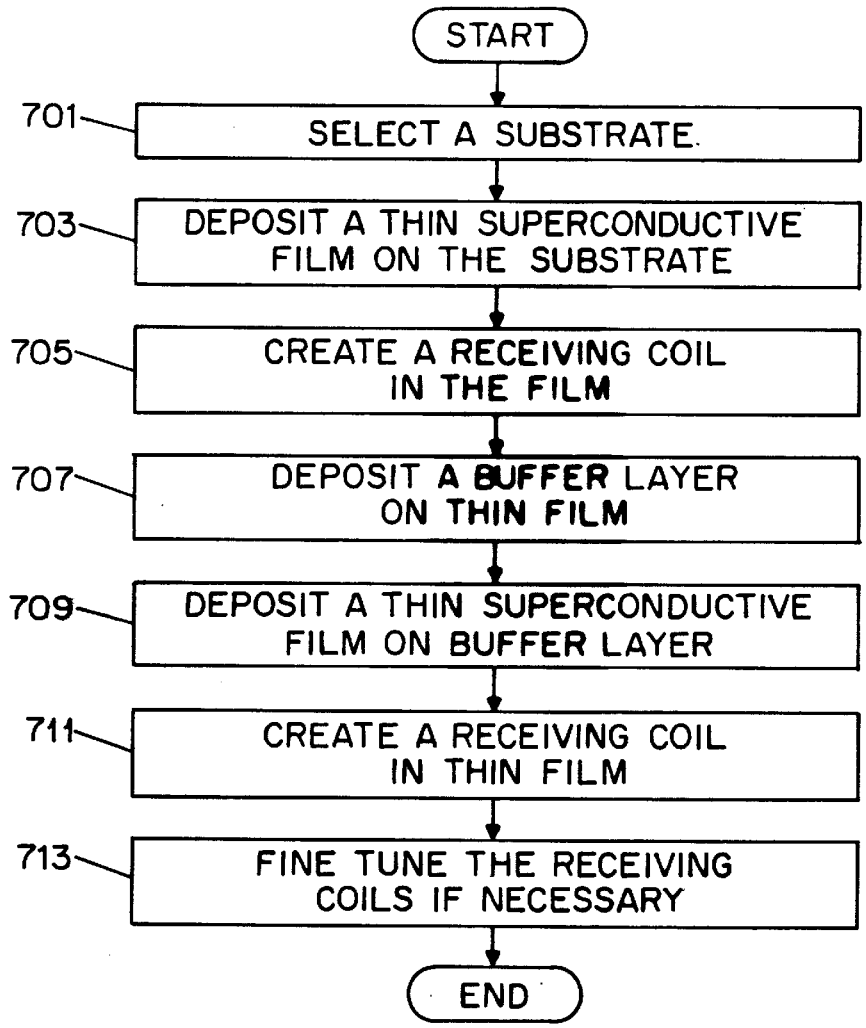
FIG. 7 is a flow chart of the steps for making the multi-layered multiple resonant probe of FIG. 6.

FIG. 7 shows the steps of making a multi-layered multiple resonance superconducting probe as shown in FIG. 6. Additional steps of making the multi-layered probe could easily be added to create a probe with three or more resonance receiving coils.

Step 701 selects a substrate on which to deposit a thin film of superconducting material. The substrates may by planar or may be flexible so that it can be bent or wrapped around a subject to be imaged An example of a substrate that can be used is $LaAlO_3$. Step 703 deposits a thin film of superconducting material on the substrate. An example of the superconducting material which could be used is $Y_1Ba_2Cu_3O_{7-x}$ (YBCO).

Step 705 then creates a single receiving coil pattern in the superconducting thin film. The coil pattern is designed to adjust both the inductance (the length of the spiral inductor) and the capacitance (the number of fingers in the coil) to have a resonance frequency approximately equal to that which it is designed to detect. The design is based upon such considerations as a significant SNR gain factor (favoring a small coil), a large FOV (favoring a large coil) and weak coupling between the coils. The design takes into account any mutual inductance between the coils by using the above described model.

This manufacturing process can be accomplished by ion implantation. A mask is used to cover the superconducting material which will form the receiving coil. An ion implantation technique is then used which causes the superconducting material which it contacts to lose its superconductivity and become insulating. However, the height of the film remains the same for both the receiving coil portion and the insulating portion. This in contrast to chemical etching or ion milling where the film surface becomes uneven due to the etching. In the case of a multi-layered probe, both implanted and unimplanted film surface portions must have the same crystal structure and be planar in order to deposit the next layer film epitaxially.

Step 709 then deposits a buffer layer on top of the first superconducting layer. The buffer layer electrically separates the receiving coils located directly above and below the buffer layer. Buffer layer materials can be selected from oxides that have similar crystal structure as HTS, such as $LaAlO_3$, $SrTiO_3$ or $CeO_2$. Step 711 then deposits a second superconducting film layer on top of the buffer layer. Step 713 once again creates a receiving coil in the superconducting thin film by ion implantation which causes the unmasked portion of the film to lose its superconductivity. Finally, step 715 finely tunes the receiving coils by removing the fingers from the coils (e.g., by laser) in order to change the capacitance of the coil which alters its resonance frequency. If a receiving coil located on the bottom film layer requires tuning, then the capacitance needs to be adjusted prior to the buffer layer being placed on top of the superconducting film. The mutual inductance is calculated as set forth above prior to the actual manufacture of the probe. The receiver coils can then be finely tuned after manufacture before the next layer is deposited on top of the particular coil layer.

Figure 8:
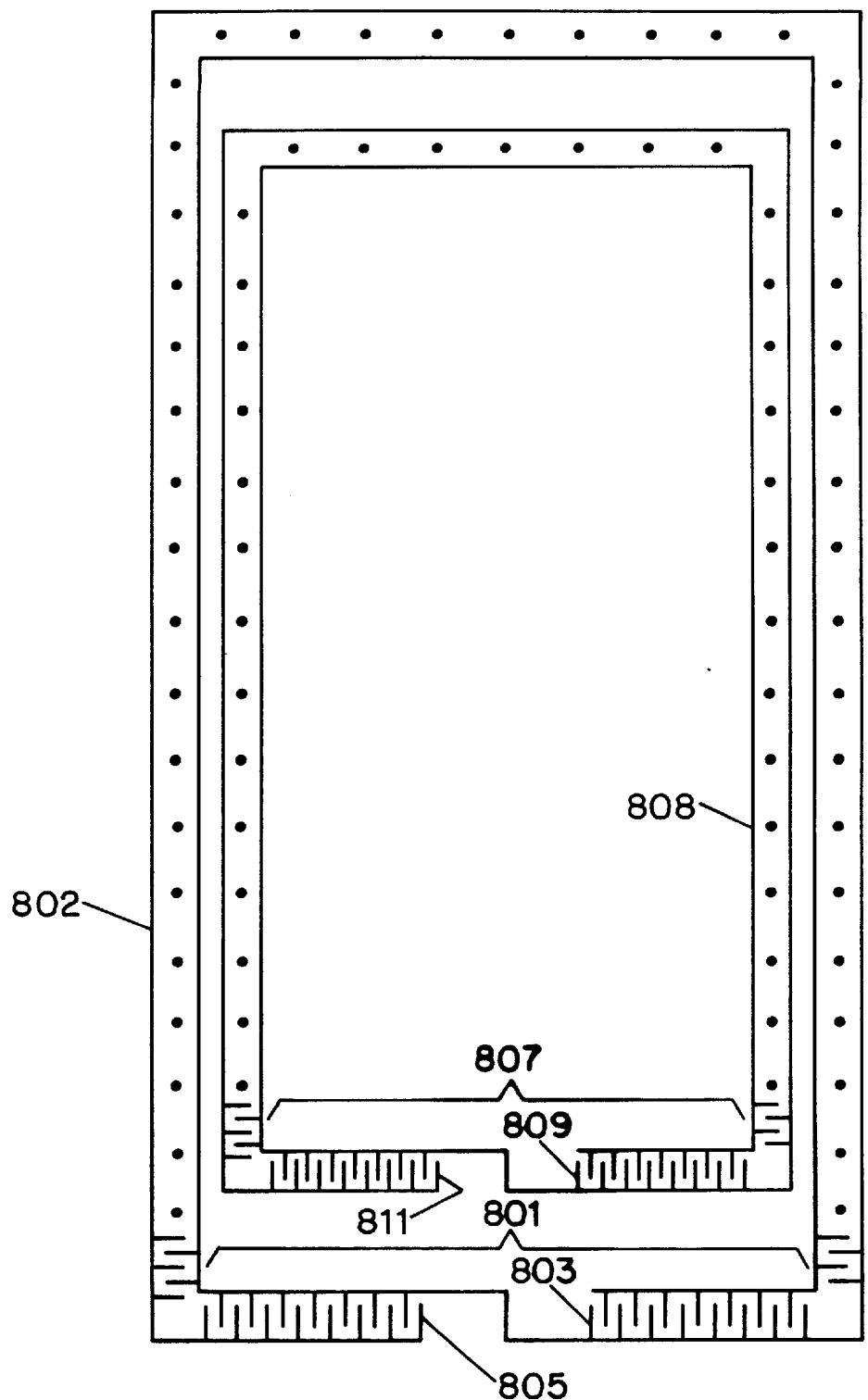
FIG. 8 shows a rectangular configuration of receiving coils for a multiple resonance superconducting probe.

FIG. 8 shows an alternate configuration of receiving coils which are arranged in accordance with this invention. While only two coils are shown in this figure, the probe could contain any number of coils depending upon the number of different frequencies which are desired to be detected. The rectangle shape of the coils creates a rectangular field of view, which is advantageous if taking a MRI of a long and narrow body part, such as a spine or finger. Outer coil 801 contains a spiral coil 802 and attached multiple fingers. Fingers 803 and 805 are shown as an example. Inner coil 807 contains a spiral coil 808 and attached fingers. Fingers 809 and 811 are shown as an example. The mutual inductance and corresponding corrections for the mutual inductance can be calculated using the previously described equations. The width and length of the probe can be adjusted to achieve an optimal filling factor (and field of view) for a particular body part. Other coil shapes can also be used to be customized to a desired field of view.

Figure 9:
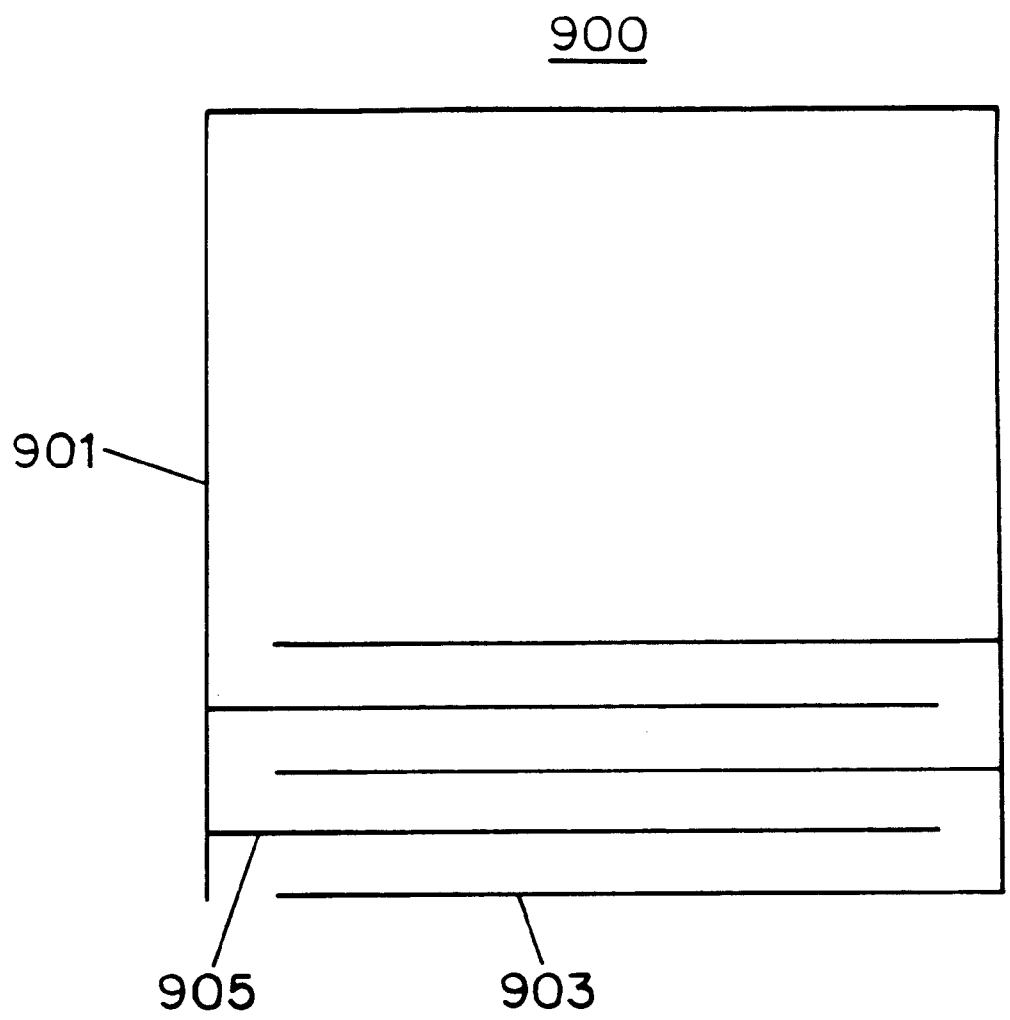
FIG. 9 shows an alternative configuration of a receiving coil in a multiple resonance superconducting probe.

FIG. 9 shows another alternate configuration a receiving coil which can be used with this invention. Coil 900 contains an inductance portion 901 and attached multiple fingers. Fingers 903 and 905 are shown as an example. Another receiving coil in the configuration of coil 900 could be placed inside the area defined by inductance portion 901 in order to have a planar probe. Alternatively, the receiving coil could be used in multiple coil layers in a configuration as described for the multi-layered probe set forth above. Each receiving coil used in this invention could be configured in a multitude of ways as long as a proper inductance portion and capacitance portion is included to achieve the desired resonance frequency for the receiving coil.

The foregoing merely illustrates the principles of the invention. It will thus be appreciated that those skilled in the art will be able to devise numerous systems, apparatus and methods which, although not explicitly shown or described herein, embody the principles of the invention and are thus within the spirit and scope of the invention as defined by its claims.

For example, the multi-resonance superconducting probe could be used as part of a unit for receiving radio, microwave or cellular transmissions of selected resonance frequencies.

We claim:

1. A multiple resonance superconducting probe comprising:

a substrate;

a plurality of nested non-overlapping thin film coils affixed to said substrate, wherein each said coil is made of superconducting material and is formed to have a different selected resonance frequency taking into account mutual inductance among said plurality of coils, and wherein each of said coils comprises a multiplicity of interdigitated fingers, the resonance frequency of the coil being dependent on the total number of interdigitated fingers therein and the mutual inductance among said plurality of coils, and the respective resonance frequency of each coil is tunable by removing one or more of the interdigitated fingers therefrom after the coil is formed.

2. The probe of claim 1, wherein said total number of said fingers is between 100 and 200.

3. The probe of claim 1, wherein said total number of fingers is between 500 and 600.

4. The probe of claim 1, where in each said coil has the same center point.

5. The probe of claim 1, wherein each said coil is circular in shape.

6. The probe of claim 1, wherein each said coil is rectangular in shape.

7. The probe of claim 1, wherein said probe has a field of view for a selected area to be imaged, and said coils are located a maximum distance apart while still maintaining an acceptable said field of view for said probe.

8. The probe of claim 1, wherein said substrate is flexible.

9. A multiple resonance superconducting probe comprising:

a substrate;

at least two coil thin film layers, each said coil being formed to have a different selected resonance frequency taking into account mutual inductance among the coils and comprising a superconductive coil; and a buffer layer located between adjacent said coil layers, wherein each of the coils comprises a multiplicity of interdigitated fingers, the respective resonance frequency of each of the coils being dependent on a total number of the interdigitated fingers therein and the mutual inductance among the coils, and wherein the respective resonance frequency of each of the coils is tunable, by removing one or more of the fingers therefrom after the coil is formed.

10. The probe of claim 9, where in each said coil has the same center point.

11. The probe of claim 9, wherein each said coil is circular in shape.

12. The probe of claim 9, wherein each said coil is rectangular in shape.

13. The probe of claim 9, wherein said substrate is flexible.

14. A method for making a multiple resonance superconducting probe comprising the steps of:

selecting a substrate;

depositing a thin superconductive film on said substrate;

creating a plurality of non-overlapping concentric coils in said thin film, each of said coils being formed to have a respective resonance frequency taking into account mutual inductances among the coils and having a respective multiplicity of interdigitated fingers; and fine turning, if necessary, the respective resonance frequency of each of the coils by removing one or more of the fingers therefrom.

15. A method for making a multiple resonance superconducting probe comprising the steps of:

selecting a substrate;

depositing a first thin superconductive film on said substrate;

creating a first coil in said first thin film, wherein said film remains approximately level;

depositing a buffer layer on said first superconductive film;

depositing a second thin superconductive film on said buffer layer;

creating a second coil in said second thin film, wherein said second thin film remains approximately level, each of the first and second coils having a respective multiplicity of interdigitated fingers and being formed to have a respective resonance frequency taking into account mutual inductance among the coils;

fine tuning, if necessary, the respective resonance frequency of the first coil by removing one or more of the fingers therefrom after the first coil is formed; and fine tuning, if necessary, the respective resonance frequency of the second coil by removing one or more of the fingers therefrom.

16. The method of claim 15, further comprising the steps of:

depositing an additional buffer layer on said second thin superconductive film;

depositing an additional thin superconductive film on said additional buffer layer;

creating an additional coil in said additional thin film, wherein said additional thin film remains approximately level, the additional coil having a respective multiplicity of interdigitated fingers and being formed to have a respective resonance frequency taking into account the mutual inductances among the coils; and fine tuning, if necessary, the respective resonance frequency of the additional coil by removing one or more fingers therefrom.

17. The method of claim 15, wherein said creating steps are performed by ion milling.

* * * * *